March 18, 1952 P. JARMOTZ 2,589,816

BALANCED SERIES LOOP SINE WAVE OSCILLATOR

Filed Feb. 8, 1945

INVENTOR.
PAUL JARMOTZ
BY
William D. Hall
Attorney

Patented Mar. 18, 1952

2,589,816

UNITED STATES PATENT OFFICE 2,589,816

BALANCED SERIES LOOP SINE WAVE OSCILLATOR

Paul Jarmotz, Boston, Mass., assignor, by mesne assignments, to the United States of America as represented by the Secretary of War Application February 8, 1945, Serial No. 576,845

4 Claims. (Cl. 250—36)

This invention in general relates to electrical circuits and more particularly to oscillator circuits.

It is difficult to construct a sine wave oscillator circuit in which the frequency of oscillation is independent of variation in tube characteristics, variation in power supply voltage or which is stable under conditions of mechanical shocks. This is especially true of fixed frequency oscillators in the audio frequency range.

In many radio circuit applications it is necessary to have an oscillator that will not change frequency when the characteristics of a tube change, when the power supply voltage changes, or when the circuit receives a mechanical shock such as might be encountered in air-borne, shipborne or mobile installations.

One object of this invention, therefore, is to present an oscillator circuit in which the frequency of oscillation is substantially independent of mechanical shocks, variation of tube characteristics, or variations in power supply voltage.

The invention, in general, comprises a resistance-capacitance oscillator circuit similar to the Wein-bridge oscillator explained in paragraph 43 of Radar Electronic Fundamentals, Navships 900,016, published in 1944, but differing therefrom in having two stages of amplification connected together in a balanced series loop by means of coupling means. The grid resistors of each of the two stages are returned to a predetermined bias. Moreover, a resistor means is inserted between the cathode of each tube and ground thus introducing cathode degeneration into these stages. The gain of these stages is reduced sufficiently by cathode degeneration so that the circuit does not overload but oscillates in a sinusoidal wave form at a frequency determined by constants of either of the coupling circuits.

For a better understanding of the invention, together with other and further objects thereof, reference is made to the following description, taken in connection with the accompanying drawings, and the scope of the invention will be pointed out in the appended claims.

In the accompanying drawing:

Fig. 1 shows the basic circuit of the invention, while

Figure 1:
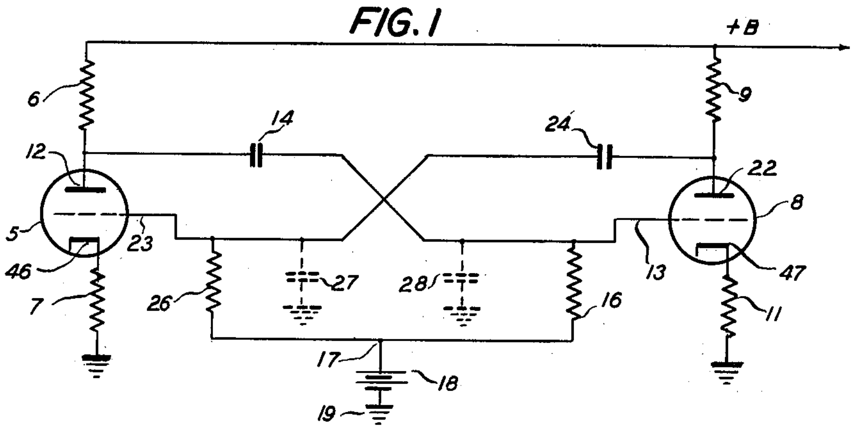

Referring now more particularly to Fig. 1 of the drawing, the basic circuit includes a stage of amplification comprising a vacuum tube 5, with a plate load resistor 6, and a cathode load resistor 7; and a second similar stage of amplification comprising vacuum tube 8, with a plate load resistor 9, and a cathode load resistor 11. Anode 12 of vacuum tube 5 is connected to control grid 13 of tube 8 by means of a coupling circuit which includes a coupling condenser 14. In this circuit a grid resistor 16 connects grid 13 to a positive terminal 17 of a bias source 18. A negative terminal 19 of bias source 18 is connected to ground.

By a similar coupling circuit anode 22 of vacuum tube 8 is connected to control grid 23 of vacuum tube 5 by coupling condenser 24. In this circuit a grid resistor 26 connects grid 23 to terminal 17 of a bias source 18. Capacitors 27 and 28 represent stray wiring capacitances and the input capacitances of tubes 5 and 8.

The operation of the circuit is as follows: a signal developed in a random manner in either tube, for example tube 5, is applied through the coupling circuit including the capacitor 14 to the control grid 13 of the tube 8. Tube 8 amplifies this signal and it is then applied through the other coupling circuit to grid 23 of tube 5. Tube 5 again amplifies this signal and, if no means were provided for limiting the gain of this series loop, the signal would soon be of such an amplitude as to overload one or both stages. To prevent this, resistors 7 and 11 are placed in the cathode circuits of tubes 5 and 8 respectively. These resistors introduce cathode degeneration in each of the stages and, therefore, limit the gain of the series loop to a value just sufficient to overcome losses in the loop.

The complete circuit shown in Fig. 1 is a balanced series loop in that resistance 6 equals resistance 9, resistance 7 equals resistance 11 while resistance 26 and capacitance 14 are equal to resistance 16 and capacitance 24 respectively. Tubes 5 and 8 have substantially similar characteristics and capacitances 27 and 28 are substantially equal. The term "series loop" is used to indicate that the output of the first stage is applied to the input of the second stage and the output of the second stage is applied to the input of the first stage.

In the design of the balanced series loop circuit the size of resistors 7 and 11 is somewhat critical. The frequency at which the above circuit will oscillate is determined by the constants of either coupling circuit. At only one particular frequency will the phase relationship of the input and output voltages be proper for oscillation. Since the series loop circuit is balanced, the frequency will be the one that causes one of the coupling circuits to have zero phase shift. This frequency may be approximated by the formula $$F=\frac{1}{2\pi\sqrt{R_1C_1R_2C_2}} \quad (1)$$

where $R_1$ is the alternating current resistance from anode 12 to ground plus any additional resistance in series with $C_1$ between anode 12 and grid 13, $C_1$ is the capacitance of the coupling capacitor 14, $R_2$ is the resistance from grid 13 to ground, in this case resistance 16, and $C_2$ is the capacitance from grid 13 to ground and includes stray capacitance 28 plus any capacitance placed in parallel with this capacitance.

$R_1$ may be approximated by the equation $$R_1=\frac{R_2[rp+R_k(\mu+1)]}{R_2+rp+R_k(\mu+1)} \quad (2)$$

where $R_2$, in this case, is resistance 6, $rp$ is the dynamic plate resistance of the tube 5, $R_k$ is resistance 7 and $\mu$ is the amplification factor of the tube 5. Since the series loop circuit is balanced, the same frequency would be determined by the above equations if the values for the other coupling circuit were used. The output of this oscillator may be taken from the anode or cathode of either tube 5 or tube 8 by suitable coupling means.

Figure 2:
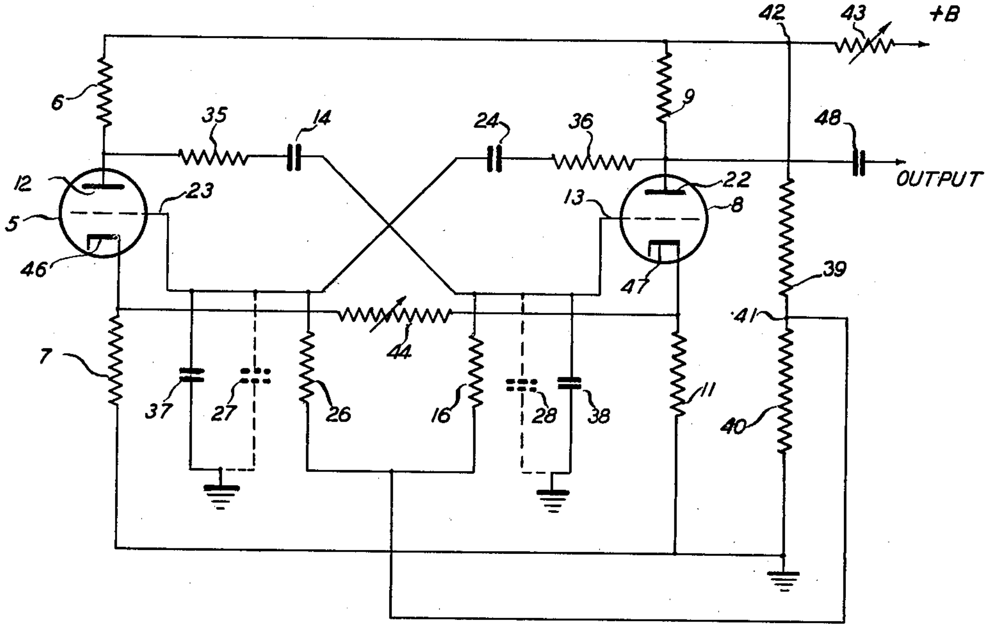
Fig. 2 shows one embodiment of the invention designed to operate at a frequency of approximately two kilocycles per second.

Referring now to Fig. 2 in which is shown a series loop circuit designed to operate at approximately two kilocycles. This circuit is similar to that shown in Fig. 1 and like parts in Figs. 1 and 2 are given the same designation. The differences are described as follows: a resistor 35 is added between anode 12 and capacitor 14 and a similar resistor 36 is added between anode 22 and capacitor 24. In computing the frequency, resistor 35 must be added to the value of $R_1$ computed in connection with the description of Fig. 1. Capacitor 37 is connected between grid 23 of tube 5 and ground and a second capacitor 38 is connected between grid 13 of tube 8 and ground. Since these capacitors are effectively in parallel with the stray capacitances represented by capacitors 27 and 28, the value of $C_2$, therefore, is the parallel combination of capacitor 37 and 27 or capacitors 28 and 38.

Bias source 18 of Fig. 1 is replaced by a voltage divider made up of resistors 39 and 40 connected between ground and terminal 42. Grid resistors 16 and 26 are returned to junction 41 of resistors 39 and 40 rather than to terminal 17 of bias source 18 as was the case in Fig. 1. Terminal 42 is connected to a source of B+ voltage through variable resistor 43. Plate load resistors 6 and 9 are returned to terminal 42 rather than B+ as was the case in Fig. 1. A variable resistor 44 is connected between cathode 46 of tube 5 and cathode 47 of tube 8. In this example, a coupling capacitor 48 is connected to anode 22 of tube 8 to provide a means of obtaining an output from this circuit.

The operation of this circuit is the same as that described in connection with Fig. 1. Resistors 35 and 36 and capacitors 37 and 38 are added to cause the circuit to operate at the desired frequency of approximately two kilocycles per second. Resistor 43 serves as a plate dropping resistor and provides a convenient means of varying the amplitude of oscillation in the circuit. Resistor 44 is added to provide a means of adjusting the series loop circuit for maximum stability of operation. The coupling capacitor 48 is provided so that a sine wave voltage output may be applied to a load such as an amplifier or a mixer. The voltage divider made up of resistors 39 and 40 is provided to maintain a positive bias on the grids 13 and 23.

In Figs. 1 and 2 balanced series loops of two stages were shown. It will be obvious to those skilled in the art that any even number of stages arranged in such a series loop might be used. The two stage circuit has the advantage, however, of requiring less circuit elements than would a circuit containing four or six stages; therefore, the two stage circuit is considered the preferred embodiment.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

I claim:

1. A circuit for producing a voltage varying substantially sinusoidally with time and the frequency of said variational voltage being substantially independent of variation in B+ voltage applied to said circuit, said circuit comprising two stages of audio amplification, each of said stages including an electron tube with at least a cathode, a grid, and an anode; means for controlling the gain of said stages by cathode degeneration, frequency selective resistive-capacitive coupling circuits for coupling said stages in a balanced-series loop, adjustable resistive means connected between said cathodes of said two stages for adjusting the stability of said circuit; and means for returning said grids of said stages to a positive bias, the frequency having such value as causes one of said coupling circuits to have zero phase shift.

2. An oscillator for producing a voltage varying substantially sinusoidally with time comprising at least two audio amplifier stages, each of said stages including an electron tube with at least a cathode, a grid, and an anode, means for coupling said stages in a balanced series loop; means for controlling the gain of said stages by cathode degeneration, means common to the circuits of each of said anodes for controlling the amplitude of said sinusoidal voltage in said oscillator, resistor means connecting said cathodes for stabilizing the operation of said oscillator, and means for returning said grids to a positive bias of such a magnitude as to insure optimum operation of said oscillator, the frequency of operation assuming a value having a zero phase shift in the coupling means.

3. A sine wave oscillator comprising: first and second vacuum tube amplifiers each including at least a cathode, anode, and grid; means for controlling the gain of each of said amplifiers by means of cathode degeneration; means applied to the grids of said amplifiers for biasing said amplifiers to conduction; first and second L networks for coupling said amplifiers in a balanced series loop, each of said L networks having a zero phase shift at the frequency of oscillation of said oscillator, said L networks respectively comprising a capacitor having one end thereof coupled to the anode of one of said amplifiers, a resistor having one end connected to the other end of said capacitor and to the grid of the other amplifier, the other end of said resistor being coupled to said biasing means, the frequency of oscillation of said oscillator having an approximate value of $$\frac{1}{2\pi R_1C_1R_2C_2}$$

where $R_1$ is the resistance from the anode of said one amplifier to ground plus any resistance in series with said capacitor, $C_1$ is the capacitance of said capacitor, $R_2$ is the resistance of said resistor, and $C_2$ is the total capacitance from the grid of said other amplifier to ground; second and third capacitors for respectively coupling the grids of said first and second amplifiers to ground; second and third resistors respectively in series with each of said first-named capacitors; and a stabilizing resistor interconnecting the cathodes of said amplifiers.

4. The oscillator of claim 3, further including variable resistor means common to both anodes of said first and second amplifiers, for controlling the amplitude of oscillation of said oscillator.

PAUL JARMOTZ.

REFERENCES CITED

The following references are of record in the file of this patent:

UNITED STATES PATENTS

| Number | Name | Date |
|---|---|---|
| 2,157,533 | Geiger | May 9, 1939 |
| 2,254,852 | Miller | Sept. 2, 1941 |
| 2,302,690 | Germeshausen | Nov. 24, 1942 |
| 2,356,071 | MacDonald et al. | Aug. 15, 1944 |
| 2,365,512 | Bartelink | Dec. 19, 1944 |
| 2,368,449 | Cook | Jan. 30, 1945 |

FOREIGN PATENTS

| Number | Country | Date |
|---|---|---|
| 489,849 | Great Britain | Aug. 4, 1938 |
| 555,078 | Great Britain | Aug. 3, 1943 |